United States Patent
Iwahori

(10) Patent No.: US 10,840,234 B2
(45) Date of Patent: Nov. 17, 2020

(54) SEMICONDUCTOR INTEGRATED CIRCUIT DEVICE

(71) Applicant: SOCIONEXT INC., Kanagawa (JP)

(72) Inventor: Junji Iwahori, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 50 days.

(21) Appl. No.: 16/386,116

(22) Filed: Apr. 16, 2019

(65) Prior Publication Data

US 2019/0244949 A1    Aug. 8, 2019

Related U.S. Application Data

(63) Continuation of application No. PCT/JP2017/035209, filed on Sep. 28, 2017.

(30) Foreign Application Priority Data

Oct. 17, 2016  (JP) ................. 2016-203262

(51) Int. Cl.
*H01L 27/02*    (2006.01)
*H01L 27/088*    (2006.01)
(Continued)

(52) U.S. Cl.
CPC .......... *H01L 27/0207* (2013.01); *H01L 21/82* (2013.01); *H01L 21/822* (2013.01); *H01L 27/04* (2013.01); *H01L 27/0886* (2013.01); *H01L 27/11803* (2013.01); *H01L 27/11807* (2013.01); *H01L 29/785* (2013.01);
(Continued)

(58) Field of Classification Search
CPC ............ H01L 27/0207; H01L 27/0886; H01L 27/11803; H01L 27/11807; H01L 21/822; H01L 29/785
See application file for complete search history.

(56) References Cited

U.S. PATENT DOCUMENTS

2009/0079488 A1    3/2009  Motoyoshi et al.
2012/0256234 A1    10/2012  Nishimura et al.
(Continued)

FOREIGN PATENT DOCUMENTS

JP    2004-289030 A    10/2004
JP    2009-076709 A    4/2009
(Continued)

OTHER PUBLICATIONS

International Search Report and Written Opinion issued in International Patent Application No. PCT/JP2017/035209; dated Dec. 5, 2017; with partial English translation.

*Primary Examiner* — Seahvosh Nikmanesh
(74) *Attorney, Agent, or Firm* — McDermott Will & Emery LLP

(57) ABSTRACT

A semiconductor integrated circuit device includes a standard cell having a plurality of height regions. A plurality of partial circuits having an identical function and each operating in response to common signals S and NS are arranged in any one of the height regions. A metal interconnect forming part of a supply path for the common signal S is arranged in the height region so as to be connected to the partial circuits, and a metal interconnect forming part of a supply path for the common signal S is arranged in the height region so as to be connected to the partial circuits.

19 Claims, 7 Drawing Sheets

(51) Int. Cl.
*H01L 27/118* (2006.01)
*H01L 21/822* (2006.01)
*H01L 21/82* (2006.01)
*H01L 27/04* (2006.01)
*H01L 29/78* (2006.01)

(52) U.S. Cl.
CPC .............. *H01L 2027/11875* (2013.01); *H01L 2027/11879* (2013.01); *H01L 2027/11881* (2013.01)

(56) References Cited

U.S. PATENT DOCUMENTS

2015/0286768 A1 10/2015 Macdonald et al.
2017/0317100 A1* 11/2017 Kang ................ H01L 27/11807

FOREIGN PATENT DOCUMENTS

JP 2012-222151 A 11/2012
JP 2012-227395 A 11/2012

\* cited by examiner

SEMICONDUCTOR INTEGRATED CIRCUIT DEVICE

CROSS-REFERENCE TO RELATED APPLICATIONS

This is a continuation of International Application No. PCT/JP2017/35209 filed on Sep. 28, 2017, which claims priority to Japanese Patent Application No. 2016-203262 filed on Oct. 17, 2016. The entire disclosures of these applications are incorporated by reference herein.

BACKGROUND

The present disclosure relates to a semiconductor integrated circuit device including a multi-height cell.

A standard cell system has been known as a method of forming a semiconductor integrated circuit on a semiconductor substrate. The standard cell system is a system in which basic units (e.g., an inverter, a latch, a flip-flop, a full adder, or any other unit) having a specific logic function are prepared in advance as standard cells, and a plurality of standard cells are arranged on a semiconductor substrate and connected together through interconnects, thereby designing an LSI chip.

In recent years, a standard cell has been designed to have a multi-height structure to increase the speed, and reduce the area, of a semiconductor integrated circuit. A standard cell having a multi-height structure, i.e., a multi-height cell, includes a plurality of single-height cells connected together in the cell height direction. The cell height of the multi-height cell is n times as large as the cell height of a single-height cell (where n is an integer equal to or greater than two).

Japanese Unexamined Patent Publication No. 2012-222151 (FIG. 1) discloses, as an example of the multi-height cell, a layout configuration of a double-height cell having a cell height that is twice as large as the cell height of a single-height cell.

SUMMARY

Some of standard cells have a circuit function including a plurality of partial circuits (here, selectors) having the same function such as a multi-bit selector. In such a circuit function, the partial circuits each operate in response to a common signal such as a select signal. If such a standard cell is configured as a multi-height cell, a supply path through which a common signal is supplied to each of the partial circuits may increase in length, and its resistance value may increase. If the resistance value of the supply path for the common signal is high, the signal delay increases. This makes it difficult for the circuit to operate at high speed, and increases the voltage drop across a signal line. Thus, the operation of the circuit becomes unstable.

The present disclosure is intended to provide a semiconductor integrated circuit device including a multi-height cell which includes a plurality of partial circuits and which is configured to be capable of increasing the speed of, and stabilizing, a circuit operation.

In one aspect of the present disclosure, a semiconductor integrated circuit device includes: a standard cell implementing a predetermined circuit function. The standard cell includes N power supply lines (where N is an integer equal to or greater than three) including a first power supply line supplying a first power supply potential and a second power supply line supplying a second power supply potential, the first and second power supply lines extending in a first direction, and being alternately arranged in a second direction perpendicular to the first direction, and a plurality of flip-flop circuits each operating in response to one or more types of common signals. Each of the flip-flop circuits is arranged in any one of M (where M=N−1) height regions each sandwiched between the first power supply line and the second power supply line. In each of first height regions, which are at least two of the M height regions, two or more of the flip-flop circuits are arranged and a metal interconnect forming a supply path for a first common signal, which is one of the common signals, is connected to at least two of the flip-flop circuits.

According to this aspect, the standard cell that implements the predetermined circuit function has two or more height regions each sandwiched between an associated adjacent pair of the first power supply lines supplying the first power supply potential and the second power supply line supplying the second power supply potential. This standard cell is a so-called multi-height cell. In this standard cell, the partial circuits having the identical function and each operating in response to the one or more types of common signals are each arranged in any one of the height regions. At least two first height regions in which two or more of the partial circuits are arranged each include the metal interconnect forming the supply path for the first common signal. The metal interconnect is connected to at least two of the partial circuits. This configuration can reduce the resistance value of the supply path for the first common signal. This can reduce the signal delay to increase the speed of a circuit operation, and can reduce the voltage drop across a signal line to stabilize the circuit operation.

According to the present disclosure, in a multi-height cell including a plurality of partial circuits, the resistance value of a supply path for a common signal to be supplied to the partial circuits can be reduced, thereby increasing the speed of, and stabilizing, a circuit operation.

BRIEF DESCRIPTION OF THE DRAWINGS

FIG. 4 is a plan view showing a layout configuration of the partial circuit shown in

FIG. 3.

DETAILED DESCRIPTION

Embodiments will be described in detail with reference to the drawings. In the following embodiments, it is assumed that a semiconductor integrated circuit device includes a plurality of standard cells, and at least some of the standard cells are multi-height cells. In the present disclosure, a region of a multi-height cell between a power supply line for supplying VDD and a power supply line for supplying VSS is referred to as a "height region." For example, a double-height cell has two height regions each sandwiched between an associated adjacent pair of three power supply lines.

First Embodiment

Figure 1:
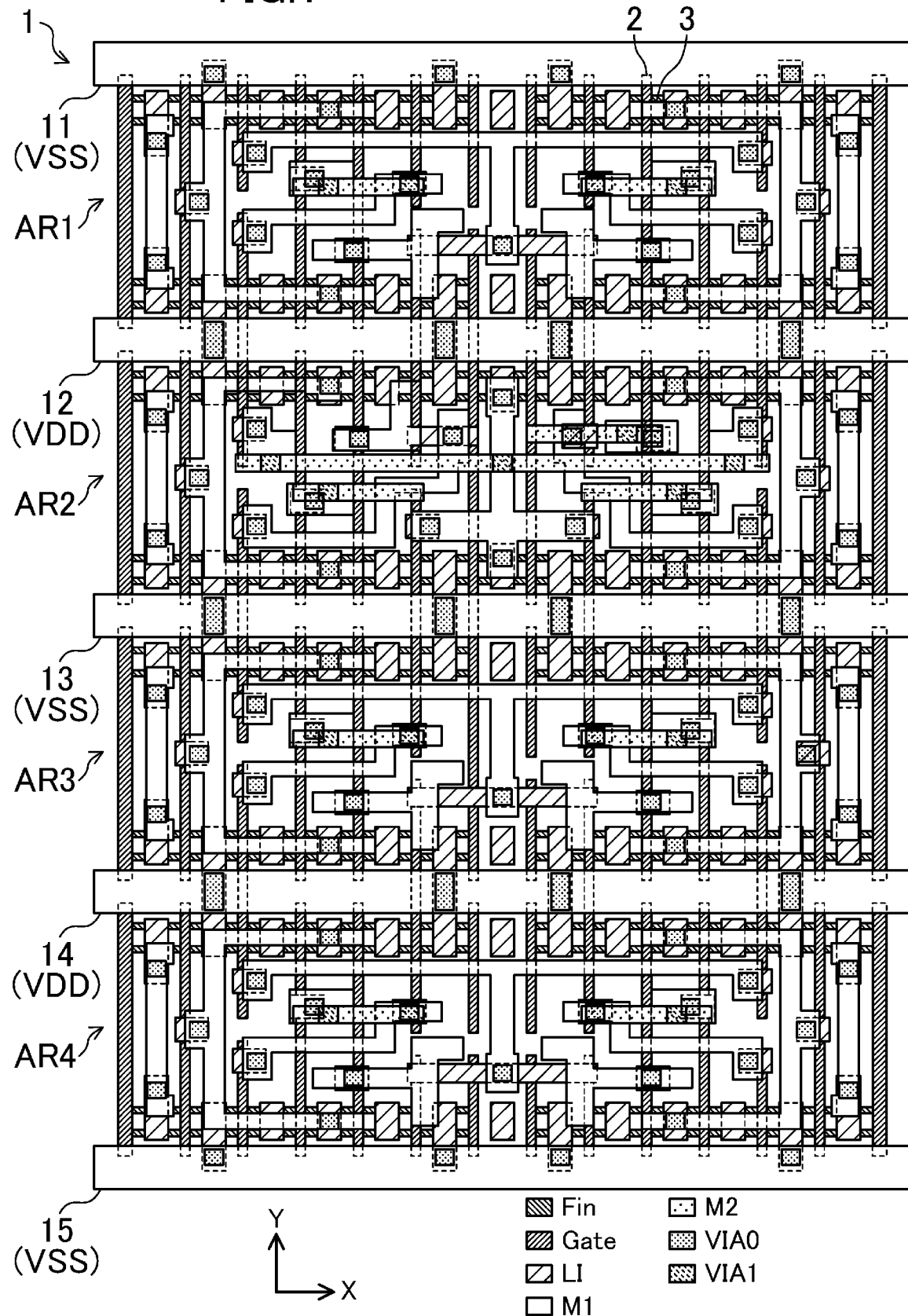
FIG. 1 is a plan view showing an example of a layout configuration of a standard cell included in a semiconductor integrated circuit device according to a first embodiment.
Figure 2:
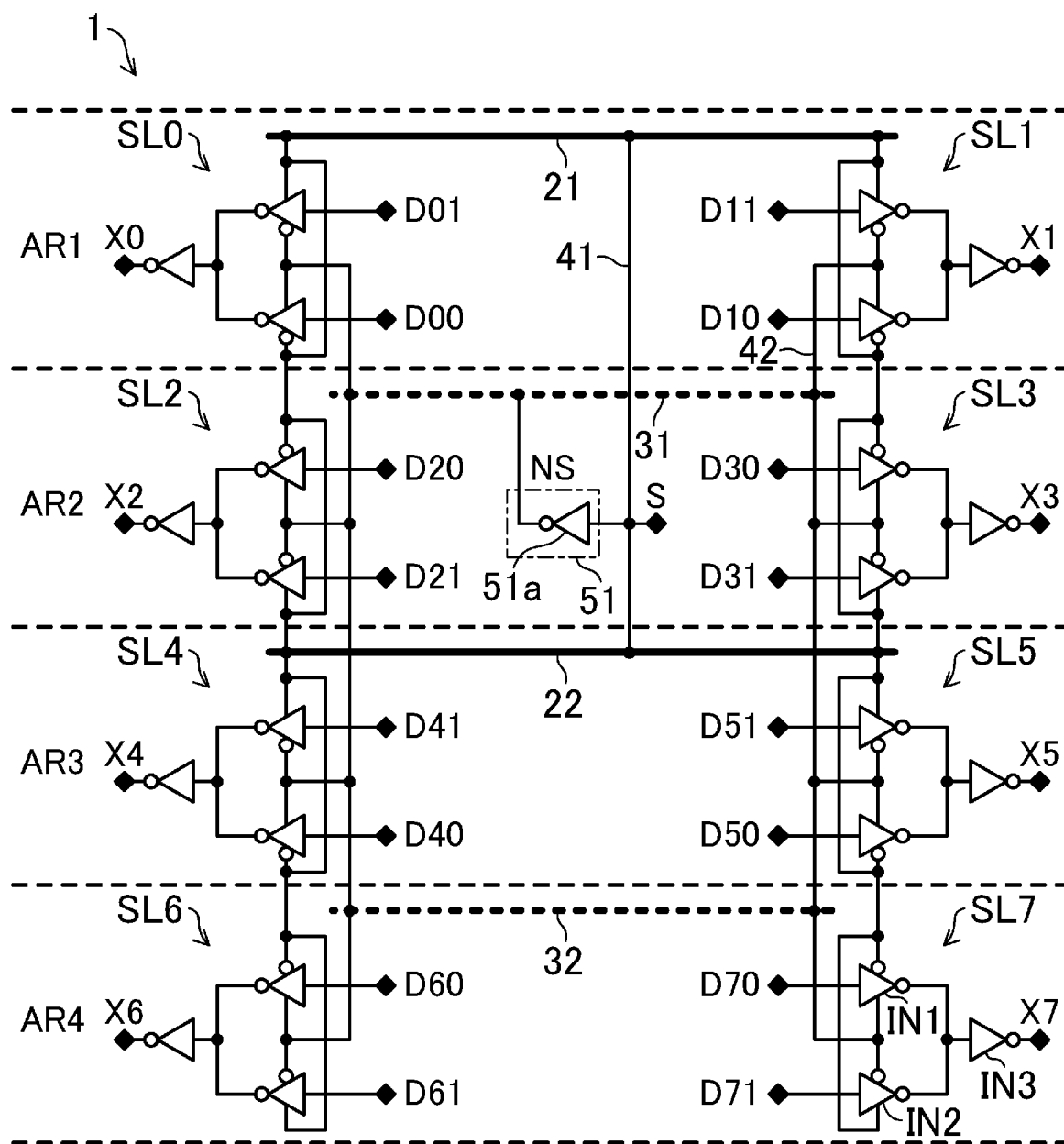
FIG. 2 is a circuit diagram of the standard cell shown in FIG. 1.

FIG. 1 is a plan view showing an example of a layout configuration of a standard cell 1 included in a semiconductor integrated circuit device according to a first embodiment. In FIG. 1, the lateral direction of the drawing is defined as an X direction (corresponding to a first direction), and the longitudinal direction of the drawing is defined as a Y direction (corresponding to a second direction). The same applies to the subsequent layout plan views. FIG. 2 is a circuit diagram of the standard cell 1 shown in FIG. 1.

As shown in FIG. 1, the standard cell 1 includes five power supply lines 11 to 15 extending in the X direction. The first power supply lines 12 and 14 for supplying VDD (a first power supply potential) and the second power supply lines 11, 13, and 15 for supplying VSS (a second power supply potential) are alternately arranged in the Y direction. Four height regions AR1 to AR4 are each formed between an associated adjacent pair of the power supply lines 11 to 15. In other words, the standard cell 1 is a so-called quad-height cell having a cell height that is four times as large as the cell height of a single-height cell. Fin field effect transistors (FETs) are formed in each of the height regions AR1 to AR4, and a predetermined circuit function is implemented by these fin FETs. The fin FETs each include a gate interconnect (Gate) 2 and a fin (Fin) 3. Further, LI is a local interconnect that is directly connected to the gate interconnect 2 and the fin 3, M1 is a metal interconnect layer formed above the local interconnect, M2 is a metal interconnect layer formed above the M1 interconnect, VIA0 is a via connecting the local interconnect and the M1 interconnect together, and VIA1 is a via connecting the M1 interconnect and the M2 interconnect together. The power supply lines 11 to 15 are formed in the metal interconnect layer M1. Note that the resistance values of the gate interconnect and the local interconnect are greater than the resistance values of the metal interconnects such as the M1 interconnect and the M2 interconnect.

As shown in FIG. 2, the standard cell 1 is an 8-bit selector, and includes eight selectors SL0 to SL7 as partial circuits. Each selector SL* (where * is an integer of 0 to 7) has two inputs D*0 and D*1 and one output X*, and operates in response to a select signal S and an inverted select signal NS complementary to the select signal S as common signals. When the select signal S is high (the inverted select signal NS is low), each selector SL* outputs the input D*1 as the output X*. When the select signal S is low (the inverted select signal NS is high), each selector SL* outputs the input D*0 as the output X*. The select signal S is supplied from the outside of the standard cell 1. The inverted select signal NS is generated based on the select signal S by a common signal generating circuit 51 including an inverter 51a. The select signal S and the inverted select signal NS are supplied to the selectors SL0 to SL7 via the respective supply paths.

Two of the eight selectors SL0 to SL7 are arranged in each of the height regions AR1 to AR4. Specifically, the selectors SL0 and SL1 are arranged in the height region AR1, the selectors SL2 and SL3 are arranged in the height region AR2, the selectors SL4 and SL5 are arranged in the height region AR3, and the selectors SL6 and SL7 are arranged in the height region AR4. The select signal S is supplied to the height region AR2, and the common signal generating circuit 51 is disposed in the height region AR2.

Figure 3:
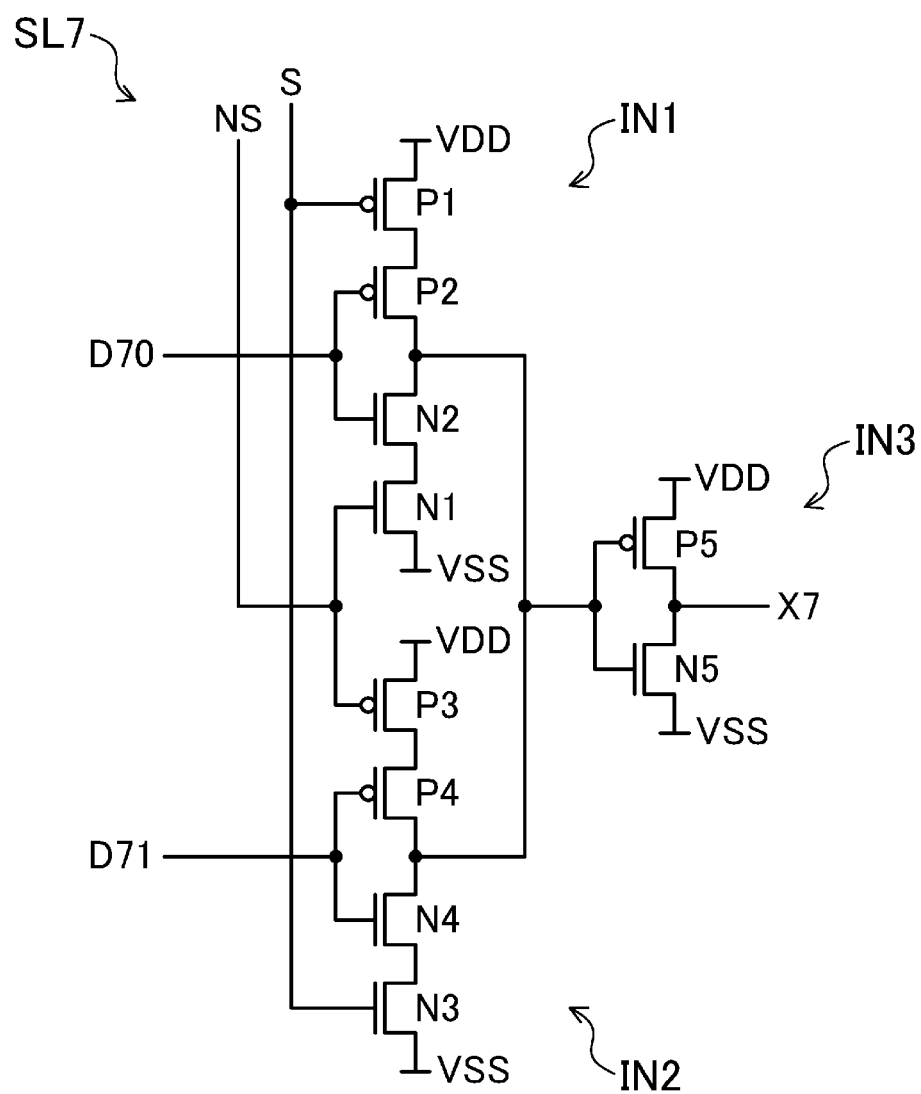
FIG. 3 is a circuit diagram showing a partial circuit included in the standard cell shown in FIG. 1 at a transistor level.

FIG. 3 is a circuit diagram of a selector serving as a partial circuit at a transistor level. FIG. 3 shows the selector SL7 as an example. The other selectors SL0 to SL6 also have the same configuration. The selector SL7 includes a tri-state inverter IN1 that receives an input D70, a tri-state inverter IN2 that receives an input D71, and an inverter IN3 that receives outputs of the tri-state inverters IN1 and IN2. The tri-state inverter IN1 includes p-type transistors P1 and P2 and n-type transistors N1 and N2, which are connected in series between the VDD and the VSS in the order of the transistors P1, P2, N2 and N1. The gates of the transistors P2 and N2 receive the input D70, and the connecting ends of the drains of the transistors P2 and N2 serve as an output of the tri-state inverter IN1. Further, the select signal S is supplied to the gate of the transistor P1, and the inverted select signal NS is supplied to the gate of the transistor N1. The tri-state inverter IN2 includes p-type transistors P3 and P4 and n-type transistors N3 and N4, which are connected in series between the VDD and the VSS in the order of the transistors P3, P4, N4, and N3. The gates of the transistors P4 and N4 receive the input D71, and the connecting ends of the drains of the transistors P4 and N4 serve as an output of the tri-state inverter IN2. Further, the select signal S is supplied to the gate of the transistor N3, and the inverted select signal NS is supplied to the gate of the transistor P3. The inverter IN3 includes a p-type transistor P5 and an n-type transistor N5 connected in series between the VDD and the VSS. The gates of the transistors P5 and N5 receive the outputs of the tri-state inverters IN1 and IN2, and the connecting ends of the drains of the transistors P5 and N5 serve as an output of the inverter IN3, i.e., an output X7 of the selector SL7.

Figure 4:
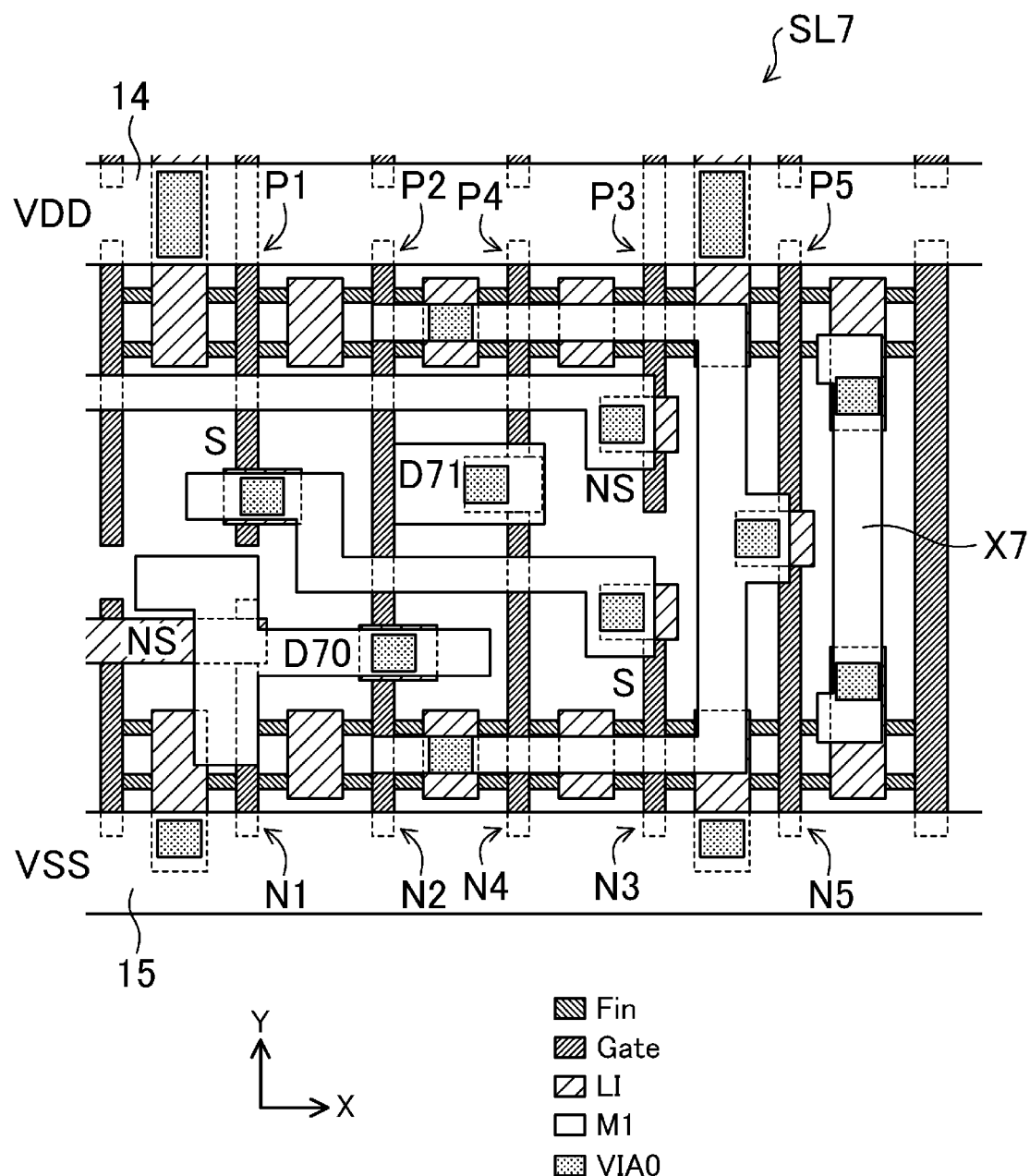

FIG. 4 is a plan view showing a layout configuration of the selector SL7 shown in FIG. 3. However, in FIG. 4, the M2 interconnect and the via VIA1 are not shown. In a p-type transistor region near the first power supply line 14, the transistors P1, P2, P4, P3, and P5 are formed in this order from the left. In an n-type transistor region near the second power supply line 15, the transistors N1, N2, N4, N3, and N5 are formed in this order from the left.

The layout of FIG. 4 corresponds to a right portion of the height region AR4 in the layout of FIG. 1. The layout of the selector SL6 on the left side of the height region AR4 is obtained by horizontally flipping the layout of FIG. 4. The layouts of the selectors SL2 and SL3 arranged in the height region AR2 are substantially the same as the layouts of the selectors SL6 and SL7 arranged in the height region AR4. Further, the layouts of the selectors SL0 and SL1 arranged in the height region AR1 and the layouts of the selectors SL4 and SL5 arranged in the height region AR3 are substantially the same as those obtained by vertically flipping the layouts of the selectors SL6 and SL7 arranged in the height region AR4.

Figure 5:
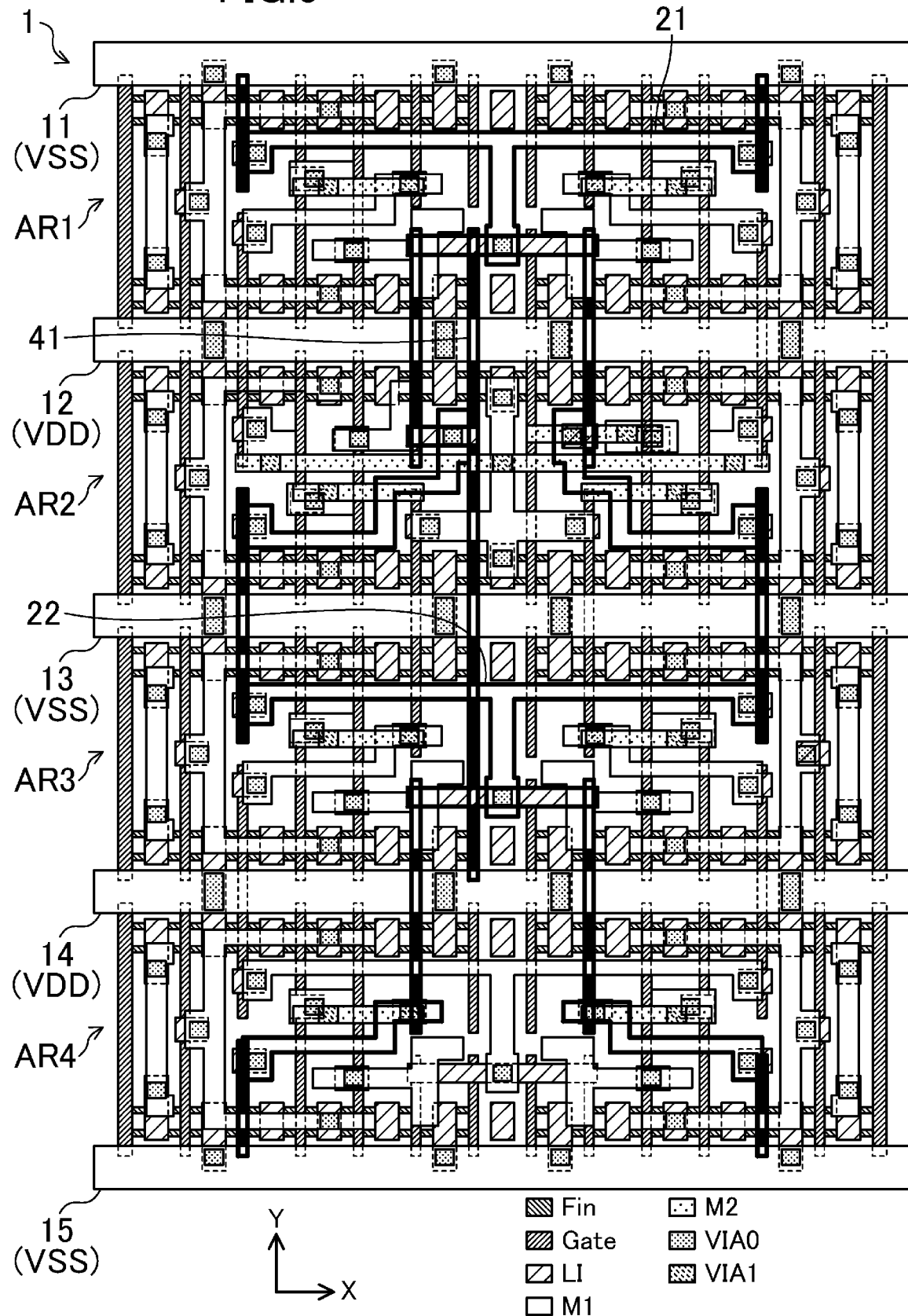
FIG. 5 is a view showing the layout of FIG. 1 in which a supply path for a common signal is highlighted.

FIG. 5 is a view showing the layout of FIG. 1 in which a supply path for the select signal S serving as the common signal is highlighted. In FIG. 5, the outlines of the metal interconnects, the local interconnects, and the gate interconnects forming the supply path for the select signal S are thickened, and the gate interconnects are solidly shaded instead of being hatched. As shown in FIG. 5, the supply path for the select signal S includes a metal interconnect 21 arranged in the height region AR1 and a metal interconnect 22 arranged in the height region AR3. The metal interconnect 21 extends in the X direction in the height region AR1, and is connected to the selectors SL0 and SL1 provided in the height region AR1. The metal interconnect 22 extends in the X direction in the height region AR3, and is connected to the selectors SL4 and SL5 provided in the height region AR3. In this case, the metal interconnects 21 and 22 are formed in the same interconnect layer M1 in which the power supply lines 11 to 15 are formed. The supply path for the select signal S further includes gate interconnects extending in the Y direction over the plurality of height regions, such as a gate interconnect 41 extending in the Y direction over the height regions AR1, AR2, and AR3.

Figure 6:
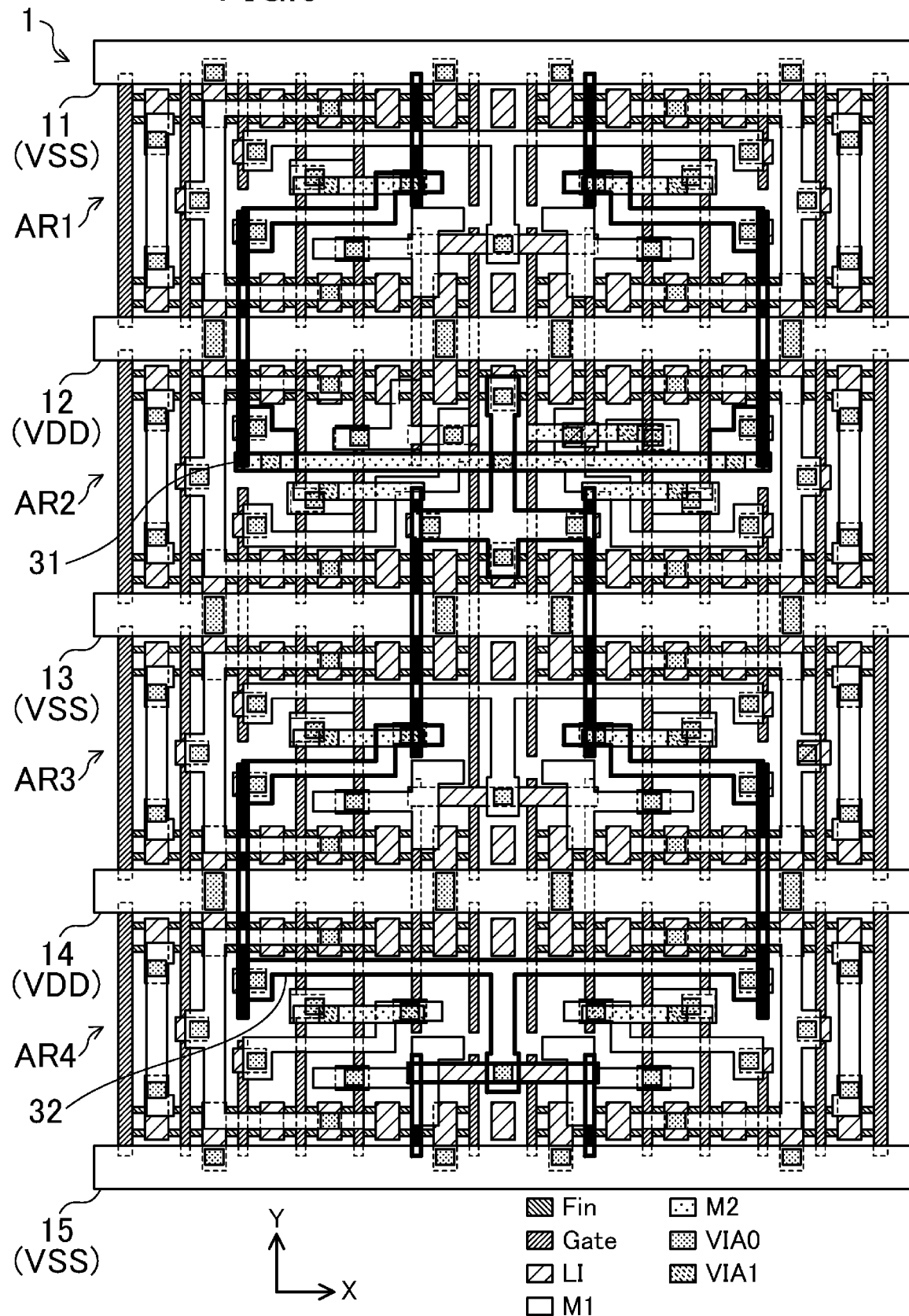
FIG. 6 is a view showing the layout of FIG. 1 in which a supply path for a common signal is highlighted.

FIG. 6 is a view showing the layout of FIG. 1 in which a supply path for the inverted select signal NS serving as a common signal is highlighted. In FIG. 6, the outlines of the metal interconnects, the local interconnects, and the gate interconnects forming the supply path for the inverted select signal NS are thickened, and the gate interconnects are solidly shaded instead of being hatched. As shown in FIG. 6, the supply path for the inverted select signal NS includes a metal interconnect 31 arranged in the height region AR2 and a metal interconnect 32 arranged in the height region AR4. The metal interconnect 31 extends in the X direction in the height region AR2, and is connected to the selectors SL2 and SL3 provided in the height region AR2. The metal interconnect 32 extends in the X direction in the height region AR4, and is connected to the selectors SL6 and SL7 provided in the height region AR4. Here, the metal interconnect 31 is formed in the interconnect layer M2 above the power supply lines 11 to 15, and the metal interconnect 32 is formed in the interconnect layer M1 in which the power supply lines 11 to 15 are formed.

As described above, according to the present embodiment, in the standard cell 1 that is a multi-height cell, two of the eight selectors SL0 to SL7 are arranged in each of the height regions AR1 to AR4. The metal interconnect 21 forming part of the supply path for the select signal S is arranged in the height region AR1 to connect the selectors SL0 and SL1 together, and the metal interconnect 22 forming part of the supply path for the select signal S is arranged in the height region AR3 to connect the selectors SL4 and SL5 together. This can reduce the resistance value of the supply path for the select signal S, thus reducing the delay of the select signal S and the voltage drop across a signal line. This can increase the speed of, and stabilize, a circuit operation of the standard cell 1.

Further, the metal interconnect 31 forming part of the supply path for the inverted select signal NS is arranged in the height region AR2 to connect the selectors SL2 and SL3 together, and the metal interconnect 32 forming part of the supply path for the inverted select signal NS is arranged in the height region AR4 to connect the selectors SL6 and SL7 together. This can reduce the resistance value of the supply path for the inverted select signal NS, thus reducing the delay of the inverted select signal NS and the voltage drop across the signal line. This can increase the speed of, and stabilize, a circuit operation of the standard cell 1.

In the present embodiment, two of the eight selectors SL0 to SL7 are arranged in each of the height regions AR1 to AR4 included in the multi-height cell. However, this configuration is merely an example of the present disclosure. For example, the number of height regions may be other than four, or the number of selectors may be other than eight. The selectors of the same number do not have to be arranged in each of the height regions.

Further, in the present embodiment, the supply path for the select signal S includes the metal interconnects 21 and 22 respectively arranged in the height regions AR1 and AR3, and the supply path for the inverted select signal NS includes the metal interconnects 31 and 32 respectively arranged in the height regions AR2 and AR4. However, this configuration is merely an example of the present disclosure. For example, metal interconnects forming the supply path for one of the select signal S and the inverted select signal NS may be respectively arranged in two or more height regions, and the supply path for the other signal may be prevented from including metal interconnects. Alternatively, metal interconnects forming the supply path for one of the select signal S and the inverted select signal NS may be respectively arranged in two or more height regions, and metal interconnects forming the supply path for the other signal may be respectively arranged in one, two, or more height regions.

In the present embodiment, the height regions AR1 and AR3 in which the metal interconnects 21 and 22 forming the supply path for the select signal S are arranged, and the height regions AR2 and AR4 in which the metal interconnects 31 and 32 forming the supply path for the inverted select signal NS are alternately arranged in the Y direction. Thus, the resistance value of the supply path for the select signal S and the resistance value of the supply path for the inverted select signal NS can be substantially equal to each other, so that the signal delay and the signal level can be balanced. However, this configuration is merely an example of the present disclosure. For example, metal interconnects forming the supply path for the select signal S may be arranged in the height regions that are continuous in the Y direction. Alternatively, a metal interconnect forming the supply path for the select signal S and a metal interconnect forming the supply path for the inverted select signal NS may be arranged in the same height region.

In the present embodiment, the metal interconnects 21 and 22 forming the supply path for the select signal S and the metal interconnects 31 and 32 forming the supply path for the inverted select signal NS are formed to extend in the X direction. However, this configuration is merely an example of the present disclosure. The metal interconnects 21 and 22 forming the supply path for the select signal S and the metal interconnects 31 and 32 forming the supply path for the inverted select signal NS are each arranged to connect two of the selectors together. However, the metal interconnects may be each arranged to connect three or more of the selectors together.

Second Embodiment

Figure 7:
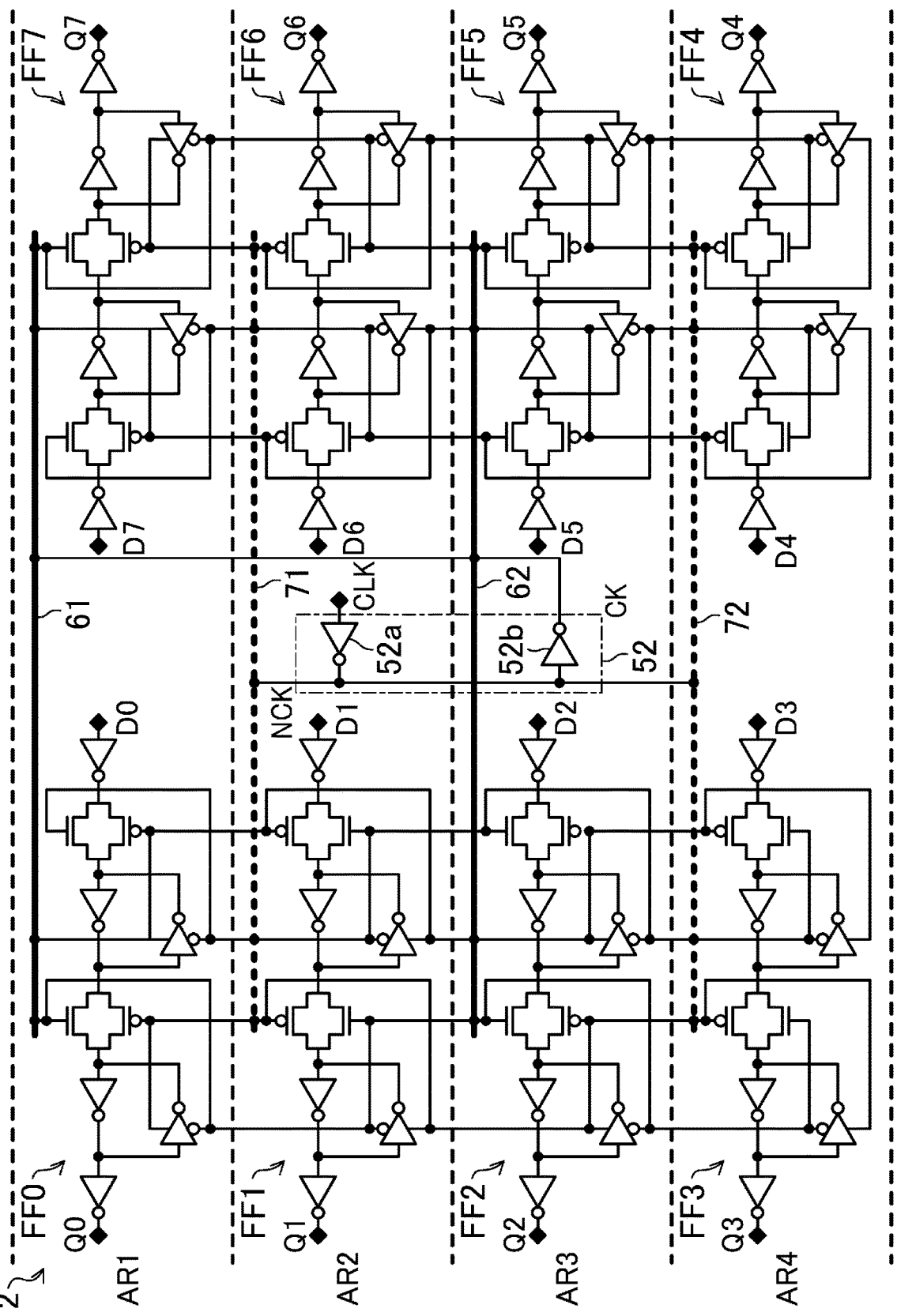
FIG. 7 is a circuit diagram of a standard cell included in a semiconductor integrated circuit device according to a second embodiment.

FIG. 7 is a circuit diagram of a standard cell 2 included in a semiconductor integrated circuit device according to a second embodiment. As shown in FIG. 7, the standard cell 2 is an 8-bit flip-flop (FF), and includes eight flip-flops FF0 to FF7 as partial circuits. Each flip-flop FF* (where * is an integer of 0 to 7) has an input D* and an output Q*, and operates in response to a clock signal CK and an inverted clock signal NCK as common signals. The clock signal CK and the inverted clock signal NCK complementary to the clock signal CK are generated by a common signal generating circuit 52 including inverters 52a and 52b based on an original clock signal CLK supplied from the outside of the standard cell 2. The clock signal CK and the inverted clock signal NCK are supplied to the flip-flops FF0 to FF7 via the respective supply paths.

Although not shown, the layout of the standard cell 2 can be the same as, or similar to, that of the standard cell 1 of the first embodiment. Specifically, the standard cell 2 includes five power supply lines extending in the X direction. First power supply lines for supplying VDD and second power supply lines for supplying VSS are alternately arranged in the Y direction. Four height regions AR1 to AR4 are each formed between an associated adjacent pair of the five power supply lines. That is to say, the standard cell 2 is a so-called quad-height cell having a cell height that is four times as large as the cell height of a single-height cell. Fin FETs are formed in each of the height regions AR1 to AR4, and a predetermined circuit function is implemented by these fin FETs.

Two of the eight flip-flops FF0 to FF7 are arranged in each of the height regions AR1 to AR4. Specifically, the flip-flops FF0 and FF7 are arranged in the height region AR1, the flip-flops FF1 and FF6 are arranged in the height region AR2, the flip-flops FF2 and FF5 are arranged in the height region AR3, and the flip-flops FF3 and FF4 are arranged in the height region AR4. The original clock signal CLK is supplied to the height region AR2, and the common signal generating circuit 52 is arranged in the height regions AR2 and AR3.

The supply path for the clock signal CK includes a metal interconnect 61 arranged in the height region AR1 and a metal interconnect 62 arranged in the height region AR3. The metal interconnect 61 extends in the X direction in the height region AR1, and is connected to the flip-flops FF0 and FF7 provided in the height region AR1. The metal interconnect 62 extends in the X direction in the height region AR3, and is connected to the flip-flops FF2 and FF5 provided in the height region AR3. Further, the supply path for the inverted clock signal NCK includes a metal interconnect 71 arranged in the height region AR2 and a metal interconnect 72 arranged in the height region AR4. The metal interconnect 71 extends in the X direction in the height region AR2, and is connected to the flip-flops FF1 and FF6 provided in the height region AR2. The metal interconnect 72 extends in the X direction in the height region AR4, and is connected to the flip-flops FF3 and FF4 provided in the height region AR4. Note that the metal interconnects 61, 62, 71, and 72 may be formed in, for example, the interconnect layer in which the power supply lines are formed, or in an interconnect layer above the power supply lines.

As described above, according to the present embodiment, two of the eight flip-flops FF0 to FF7 are arranged in each of the height regions AR1 to AR4 in the standard cell 2 that is a multi-height cell. Then, the metal interconnect 61 forming part of the supply path for the clock signal CK is arranged in the height region AR1 to connect the flip-flops FF0 and FF7 together, and the metal interconnect 62 forming part of the supply path for the clock signal CK is arranged in the height region AR3 to connect the flip-flops FF2 and FF5 together. This can reduce the resistance value of the supply path for the clock signal CK, thus reducing the delay of the clock signal CK and the voltage drop across a signal line. This can increase the speed of, and stabilize, a circuit operation of the standard cell 2.

The metal interconnect 71 forming part of the supply path for the inverted clock signal NCK is arranged in the height region AR2 to connect the flip-flops FF1 and FF6 together, and the metal interconnect 72 forming part of the supply path for the inverted clock signal NCK is arranged in the height region AR4 to connect the flip-flops FF3 and FF4 together. This can reduce the resistance value of the supply path for the inverted clock signal NCK, thus reducing the delay of the inverted clock signal NCK and the voltage drop across a signal line. This can increase the speed of, and stabilize, a circuit operation of the standard cell 2.

In the present embodiment, two of the eight flip-flops FF0 to FF7 are arranged in each of the height regions AR1 to AR4 included in the multi-height cell. However, this configuration is merely an example of the present disclosure. For example, the number of height regions may be other than four, and the number of flip-flops may be other than eight. In addition, flip-flops of the same number do not have to be arranged in each of the height regions.

In the present embodiment, the supply path for the clock signal CK includes the metal interconnects 61 and 62 respectively arranged in the height regions AR1 and AR3, and the supply path for the inverted clock signal NCK includes the metal interconnects 71 and 72 respectively arranged in the height regions AR2 and AR4. However, this configuration is merely an example of the present disclosure. For example, metal interconnects forming the supply path for one of the clock signal CK and the inverted clock signal NCK may be respectively arranged in two or more height regions, and the supply path for the other signal may be prevented from including metal interconnects. Alternatively, metal interconnects forming the supply path for one of the clock signal CK and the inverted clock signal NCK may be respectively arranged in two or more height regions, and metal interconnects forming the supply path for the other signal may be respectively arranged in one, two, or more height regions.

In the present embodiment, the height regions AR1 and AR3 in which the metal interconnects 61 and 62 forming the supply path for the clock signal CK are arranged, and the height regions AR2 and AR4 in which the metal interconnects 71 and 72 forming the supply path for the inverted clock signal NCK are alternately arranged in the Y direction. Thus, the resistance value of the supply path for the clock signal CK and the resistance value of the supply path for the inverted clock signal NCK can be substantially equal to each other, so that the signal delay and the signal level can be balanced. However, this configuration is merely an example of the present disclosure. For example, metal interconnects forming the supply path for the clock signal CK may be arranged in the height regions that are continuous in the Y direction. Alternatively, a metal interconnect forming the supply path for the clock signal CK and a metal interconnect forming the supply path for the inverted clock signal NCK may be arranged in the same height region.

In the present embodiment, the metal interconnects 61 and 62 forming the supply path for the clock signal CK and the metal interconnects 71 and 72 forming the supply path for the inverted clock signal NCK are formed to extend in the X direction. However, this configuration is merely an example of the present disclosure. The metal interconnects 61 and 62 forming the supply path for the clock signal CK and the metal interconnects 71 and 72 forming the supply path for the inverted clock signal NCK are each arranged to connect two of the flip-flops together. However, the metal interconnects may be each arranged to connect three or more of the flip-flops together.

Other Embodiments

In the foregoing embodiments, the selectors and the flip-flops have been described as examples of the partial circuits constituting the standard cell. However, in the present disclosure, the partial circuits constituting the standard cell are not limited to the selectors and the flip-flops. For example, latches may be used.

Further, in the foregoing embodiments, the select signal and the clock signal have been described as examples of the common signals to be supplied to the partial circuits. However, in the present disclosure, the common signals to be supplied to the partial circuits are not limited to the select signal and the clock signal. For example, the feature of the present disclosure may be used for a reset signal, a set signal, a scan mode signal, and other signals.

In the foregoing embodiments, the standard cell including a plurality of partial circuits includes fin FETs. However, in the present disclosure, the transistors constituting the standard cell are not limited to the fin FETs.

Note that the constituent elements in embodiments may be combined in any given manner within the scope of the present disclosure.

The present disclosure can increase the speed of, and stabilize, a circuit operation in a multi-height cell including a plurality of partial circuits. Thus, the present disclosure is useful for improvement in the performance of a semiconductor integrated circuit device.

What is claimed is:

1. A semiconductor integrated circuit device comprising: a standard cell implementing a predetermined circuit function, wherein
the standard cell includes
N power supply lines (where N is an integer equal to or greater than three) including a first power supply line supplying a first power supply potential and a second power supply line supplying a second power supply potential, the first and second power supply lines extending in a first direction, and being alternately arranged in a second direction perpendicular to the first direction, and
a plurality of flip-flop circuits each operating in response to one or more types of common signals,
each of the flip-flop circuits is arranged in any one or more of M (where M=N−1) height regions each sandwiched between the first power supply line and the second power supply line,
in each of first height regions, which are at least two of the M height regions, two or more of the flip-flop circuits are arranged at least partly and a metal interconnect forming a supply path for a first common signal, which is one of the common signals, is arranged and connected to at least two of the flip-flop circuits.

2. The semiconductor integrated circuit device of claim 1, wherein the standard cell includes a common signal generating circuit generating the first common signal.

3. The semiconductor integrated circuit device of claim 1, wherein the supply path for the first common signal includes a gate interconnect extending in the second direction over two or more adjacent ones of the M height regions.

4. The semiconductor integrated circuit device of claim 1, wherein the M height regions include a height region without the metal interconnect forming the supply path for the first common signal.

5. The semiconductor integrated circuit device of claim 1, wherein the metal interconnect arranged in each of the first height regions and forming the supply path for the first common signal extends in the first direction.

6. The semiconductor integrated circuit device of claim 1, wherein the first common signal is a clock signal.

7. The semiconductor integrated circuit device of claim 6, wherein
the common signal includes an inverted clock signal, which is an inverted signal of the clock signal,
in a second height region, which is at least one of the M height regions, two or more of the flip-flop circuits are arranged at least partly and a second metal interconnect forming a supply path for the inverted clock signal is arranged and connected to at least two of the flip-flop circuits.

8. The semiconductor integrated circuit device of claim 7, wherein the second height region is a height region different from the first height regions.

9. The semiconductor integrated circuit device of claim 8, wherein the M height regions include the first height regions and the second height region alternately arranged in the second direction.

10. A semiconductor integrated circuit device comprising: a standard cell implementing a predetermined circuit function, wherein
the standard cell includes
N power supply lines (where N is an integer equal to or greater than three) including a first power supply line supplying a first power supply potential and a second power supply line supplying a second power supply potential, the first and second power supply lines extending in a first direction, and being alternately arranged in a second direction perpendicular to the first direction, and
a plurality of partial circuits having an identical function, and each operating in response to one or more types of common signals,
each of the partial circuits is arranged in any one or more of M (where M=N−1) height regions each sandwiched between an associated adjacent pair of the first and second power supply lines,
in each of first height regions, which are at least two of the M height regions, two or more of the partial circuits are arranged at least partly and a metal interconnect forming a supply path for a first common signal, which is one of the common signals, is arranged and connected to at least two of the partial circuits.

11. The semiconductor integrated circuit device of claim 10, wherein the standard cell includes a common signal generating circuit generating the first common signal.

12. The semiconductor integrated circuit device of claim 10, wherein the standard cell receives the first common signal from outside of the standard cell.

13. The semiconductor integrated circuit device of claim 10, wherein the supply path for the first common signal includes a gate interconnect extending in the second direction over two or more adjacent ones of the M height regions.

14. The semiconductor integrated circuit device of claim 10, wherein the M height regions include a height region without the metal interconnect forming the supply path for the first common signal.

15. The semiconductor integrated circuit device of claim 10, wherein
the common signals includes a second common signal that is complementary to the first common signal, and
in a second height region, which is at least one of the M height regions, two or more of the partial circuits are arranged at least partly and a metal interconnect forming a supply path for the second common signal is arranged and connected to at least two of the partial circuits.

16. The semiconductor integrated circuit device of claim 15, wherein the second height region is a height region different from the first height regions.

17. The semiconductor integrated circuit device of claim 16, wherein the M height regions include the first height regions and the second height region alternately arranged in the second direction.

18. The semiconductor integrated circuit device of claim 10, wherein the metal interconnect arranged in each of the first height regions and forming the supply path for the first common signal extends in the first direction.

19. The semiconductor integrated circuit device of claim 10, wherein the partial circuits are selectors or latches.

* * * * *